(12) United States Patent
Shibata

(10) Patent No.: US 8,004,889 B2
(45) Date of Patent: Aug. 23, 2011

(54) SEMICONDUCTOR MEMORY DEVICE CAPABLE OF LOWERING A WRITE VOLTAGE

(75) Inventor: Noboru Shibata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 188 days.

(21) Appl. No.: 12/407,295

(22) Filed: Mar. 19, 2009

(65) Prior Publication Data
US 2009/0316479 A1    Dec. 24, 2009

(30) Foreign Application Priority Data

Jun. 19, 2008 (JP) ................................. 2008-160691

(51) Int. Cl.
  *G11C 11/34* (2006.01)
  *G11C 16/04* (2006.01)
(52) U.S. Cl. ......... 365/185.03; 365/185.17; 365/185.18; 365/185.19
(58) Field of Classification Search ......... 365/185.03 O, 365/185.17 X, 185.18 X, 185.19 X, 185.33, 365/185.03, 185.17, 185.18, 185.19
See application file for complete search history.

(56) References Cited

U.S. PATENT DOCUMENTS

| | | | | |
|---|---|---|---|---|
| 6,069,823 A * | 5/2000 | Takeuchi et al. | ......... | 365/185.22 |
| 6,657,891 B1 | 12/2003 | Shibata et al. | | |
| 7,376,017 B2 * | 5/2008 | Kim | ......... | 365/185.23 |
| 7,502,263 B2 * | 3/2009 | Park | ......... | 365/185.17 |
| 7,545,680 B2 * | 6/2009 | Kim et al. | ......... | 365/185.23 |

FOREIGN PATENT DOCUMENTS

JP   2004-192789   7/2004

* cited by examiner

*Primary Examiner* — VanThu Nguyen
(74) *Attorney, Agent, or Firm* — Oblon, Spivak, McClelland, Maier & Neustadt, L.L.P.

(57) ABSTRACT

A memory cell array is configured so that a plurality of memory cells storing one value of an n value (n is a natural number more than 2) are arranged in a matrix. A control circuit controls the voltage of a word line and a bit line in accordance with input data. The control circuit supplies a first voltage to a word line of a selected cell in a write operation, and supplies a second voltage to at least one word line adjacent to the selected cell. Thereafter, the control circuit changes a voltage of the at least one word line adjacent to the selected cell from the second voltage to a third voltage (second voltage<third voltage), and further, changes the voltage of the word line of the selected cell from the first voltage to a fourth voltage (first voltage<fourth voltage).

12 Claims, 13 Drawing Sheets

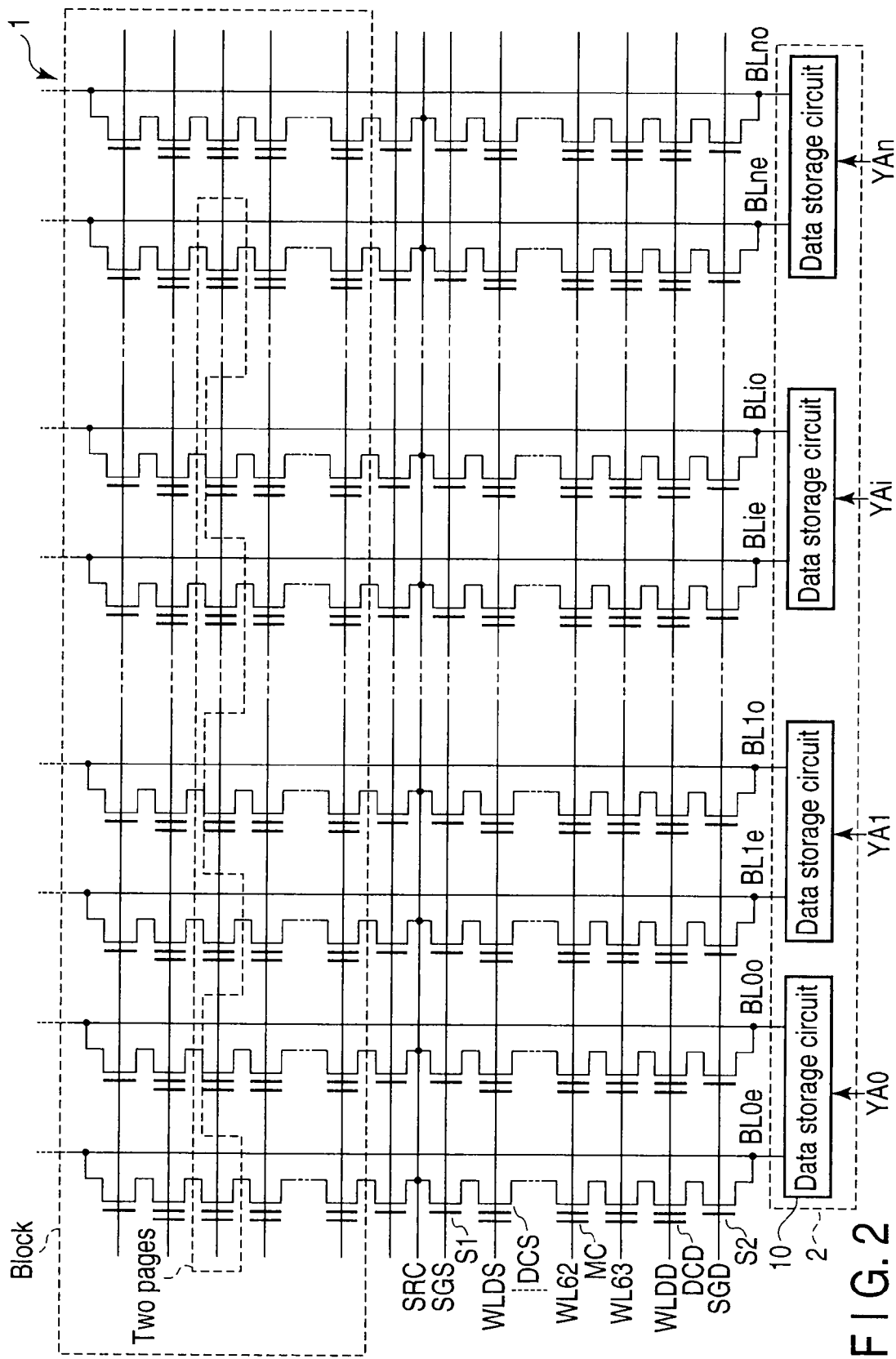
F I G. 2

|  | Cell (P-Well) | Cell (N-Well) | H.V.Tr (P-sub) | L.V.Nch (P-well) | L.V.Pch (N-well) | H.V.Pch (N-well) |
|---|---|---|---|---|---|---|
| Erase | Vera (20V) | Vera (20V) | Vss (0V) | Vss (0V) | Vdd (2.5V) | Vdd (2.5V) |
| Program | Vss (0V) | Vss (0V) | Vss (0V) | Vss (0V) | Vdd (2.5V) | Vdd (2.5V) / VpgmH(VpassH) |
| Read | Vss (0V) | Vss (0V) | Vss (0V) | Vss (0V) | Vdd (2.5V) | Vdd (2.5V) / VreadH |

F I G. 6

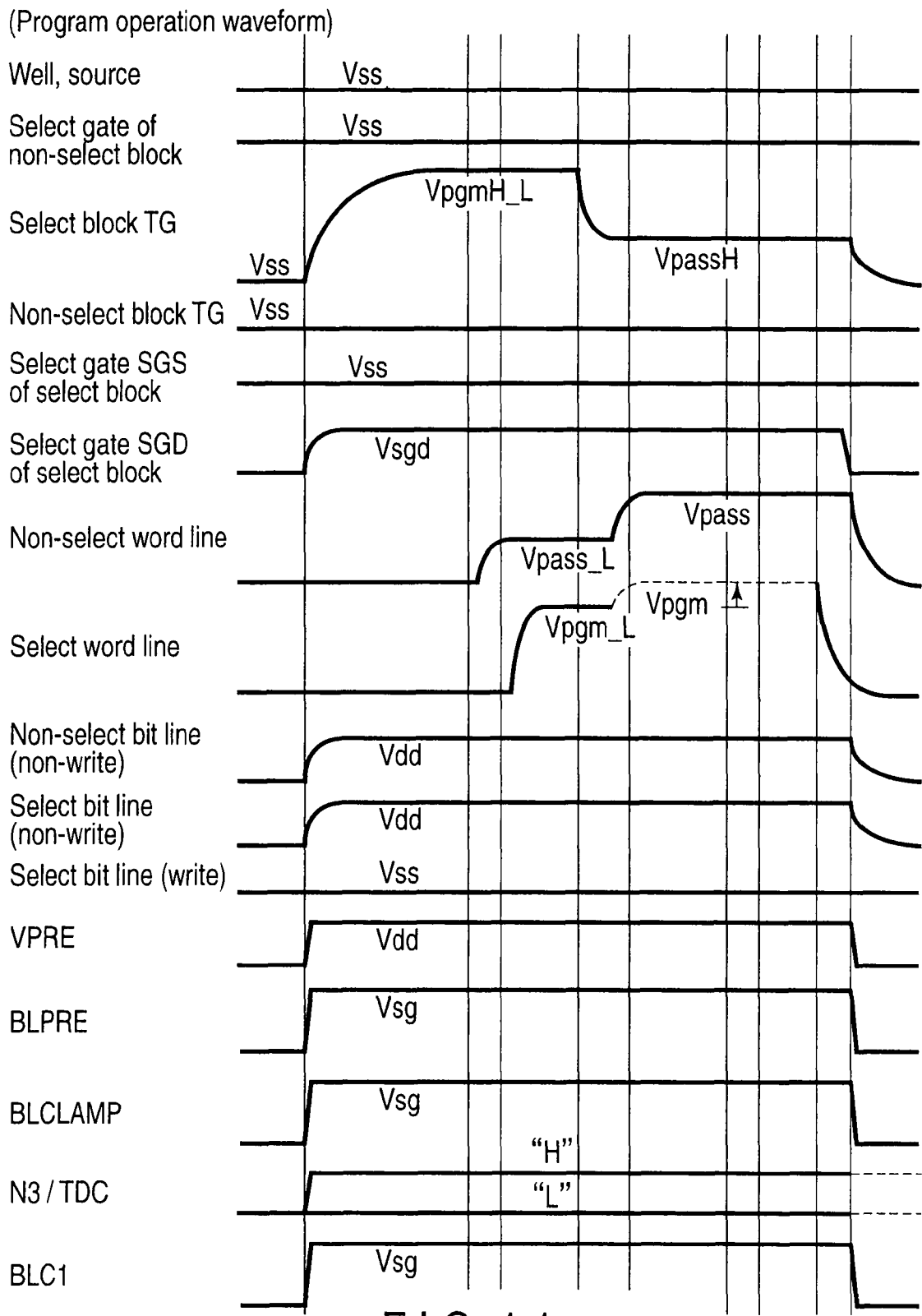
F I G. 11

SEMICONDUCTOR MEMORY DEVICE CAPABLE OF LOWERING A WRITE VOLTAGE

CROSS-REFERENCE TO RELATED APPLICATIONS

This application is based upon and claims the benefit of priority from prior Japanese Patent Application No. 2008-160691, filed Jun. 19, 2008, the entire contents of which are incorporated herein by reference.

BACKGROUND OF THE INVENTION

1. Field of the Invention

The present invention relates to a NAND flash memory. In particular, the present invention relates to a semiconductor memory device which is capable of storing multi-value data in a memory cell.

2. Description of the Related Art

A NAND flash memory has a NAND cell, which is configured in the following manner. Specifically, all of the cells arrayed in the row direction are connected to a word line, and all of the cells arrayed in the column direction, or half of the cells thereof are serial-connected, and thus, the NAND cell is configured. The drain of each NAND cell is connected to a bit line via a select gate. Each bit line is connected to a write and read latch circuit. A write or read operation is collectively carried out with respect to all of the cells arrayed in the row direction, or half of the cells thereof (e.g., 2 to 4 K bytes). According to an erase operation, the threshold voltage of a memory cell is set to a negative voltage, and then, electrons are injected into the memory cell via a write operation, and thereby, the threshold voltage is set to a positive voltage (see, e.g., Jpn. Pat. Appln. KOKAI Publication No. 2004-192789).

The NAND flash memory has a plurality of serial-connected memory cells. For this reason, in a read operation, a non-select cell needs to be set to an on state, and thus, a read voltage (Vread) higher than the threshold voltage is applied to the gate of the cell. Therefore, the threshold voltage in the write operation never exceeds the voltage Vread. For this reason, in the write sequence, program and program verify read are repeated for each bit, and threshold distribution must be controlled not to exceed the voltage Vread. As a result, the write speed becomes slow.

In order to store a large capacity, a multi-value memory storing two bits or more in one cell has been developed. For example, if one cell is stored with two bits, four threshold distributions must be set. Compared with a memory storing one bit in one cell, one threshold distribution written in a cell needs to be narrowed. For this reason, the write speed becomes slow compared with a memory storing one bit.

Therefore, a high-level write is carried out as a whole, and thereby, it is possible to use a wide range of threshold voltages. This serves to perform high-speed write and to set many threshold levels. However, a high write voltage is required; for this reason, there is a need to provide a transistor that can endure a higher write voltage. In addition, the following problem arises; specifically, a peripheral circuit must be provided with a very large step-up circuit to generate the high voltage. Therefore, it is desired to provide a semiconductor memory device that can lower a write voltage and reduce a breakdown voltage of a transistor.

BRIEF SUMMARY OF THE INVENTION

According to a first aspect of the invention, there is provided a semiconductor memory device comprising: a memory cell array connected to a word line and a bit line, and composed of a plurality of memory cells arranged in a matrix, which store one value of an n value (n is a natural number more than 2); and a control circuit configure to control each voltage of the word line and the bit line in accordance with input data, the control circuit supplying a first voltage to a word line of a selected cell in a write operation, and supplying a second voltage to at least one word line adjacent to the selected cell, and thereafter, changing a voltage of said at least one word line adjacent to the selected cell from the second voltage to a third voltage (second voltage<third voltage), and further, changing the voltage of the word line of the selected cell from the first voltage to a fourth voltage (first voltage<fourth voltage).

According to a second aspect of the invention, there is provided a semiconductor memory system comprising: a memory cell array connected to a word line and a bit line, and composed of a plurality of memory cells arranged in a matrix, which store one value of an n value (n is a natural number more than 2); and a control circuit configured to control each voltage of the word line and the bit line in accordance with input data, the control circuit supplying a first voltage to a word line of a selected cell in a write operation, and supplying a second voltage to at least one word line adjacent to the selected cell, and thereafter, changing a voltage of said at least one word line adjacent to the selected cell from the second voltage to a third voltage (second voltage<third voltage), and further, changing the voltage of the word line of the selected cell from the first voltage to a fourth voltage (first voltage<fourth voltage).

According to a third aspect of the invention, there is provided a write method used for a semiconductor memory device, comprising: supplying a first voltage to a word line of a selected cell; supplying a second voltage to at least one word line adjacent to the selected cell; and setting a voltage of said at least one word line adjacent to the selected cell from the second voltage to a third voltage (second voltage<third voltage), and setting a voltage of a word line of the selected cell from the first voltage to a fourth voltage (first voltage<fourth voltage).

BRIEF DESCRIPTION OF THE SEVERAL VIEWS OF THE DRAWING

FIG. 2 is a circuit diagram showing the configuration of a memory cell array;

FIG. 6 is a table showing voltages supplied to regions shown in FIG. 5;

FIG. 11 is a waveform chart showing a write operation according to a first embodiment;

DETAILED DESCRIPTION OF THE INVENTION

Various embodiments of the present invention will be hereinafter described with reference to the accompanying drawings.

First Embodiment

Figure 1:
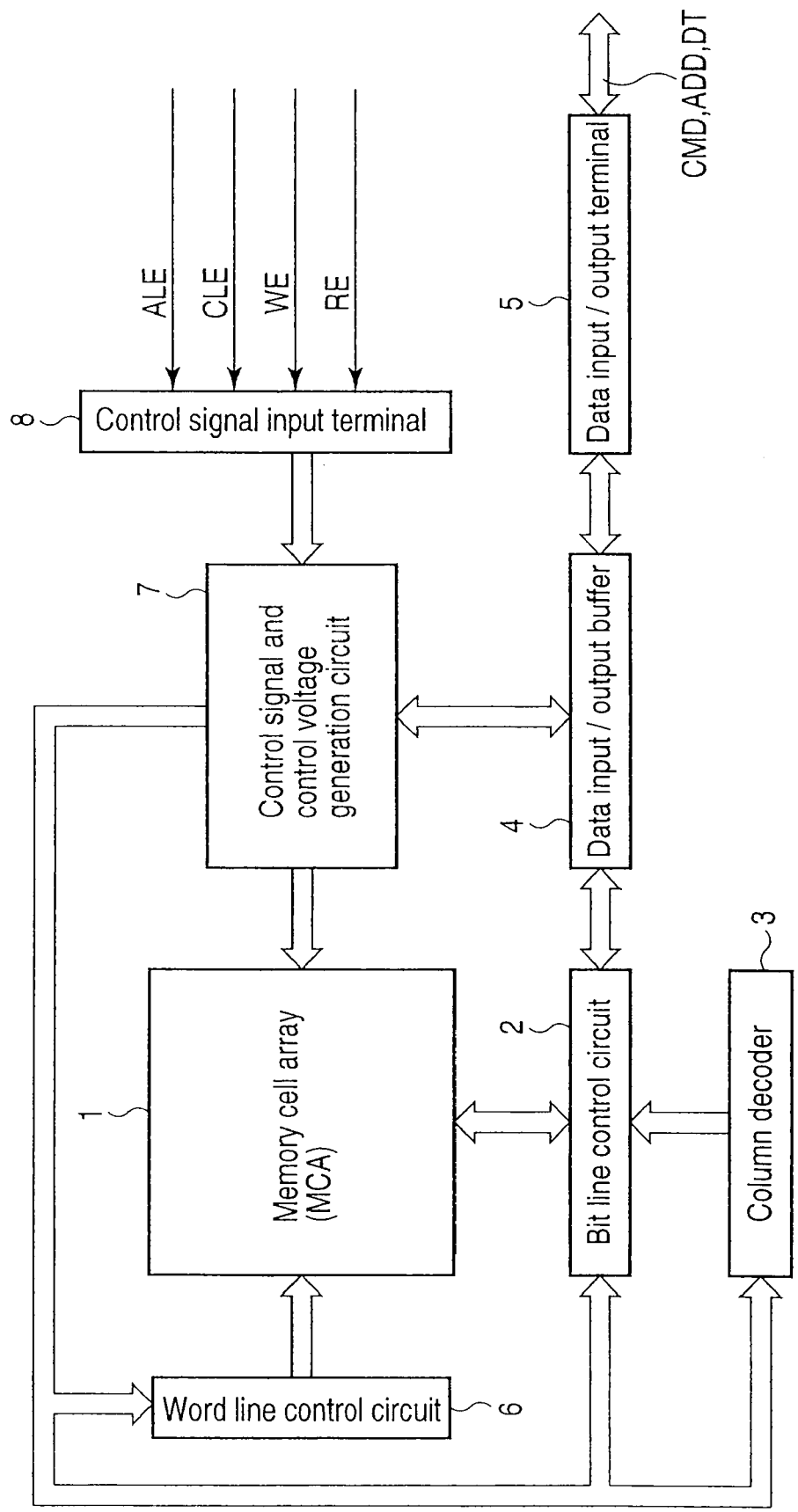
FIG. 1 is a block diagram schematically showing the configuration of a semiconductor memory device according to a first embodiment.

FIG. 1 shows the configuration of a NAND flash memory, which stores binary values (one bit) or four values (two bits).

A memory cell array 1 includes a plurality of bit lines, a plurality of word lines and a common source line. For example, the memory cell array includes electrical data rewritable memory cells, which each comprise EEPROM cells arrayed in a matrix. The memory cell array 1 is connected with a bit line control circuit 2 for controlling the bit lines and a word line control circuit 6 for controlling the word lines.

The bit line control circuit 2 executes the following operations. One is an operation of reading data of a memory cell of the memory cell array 1 via the bit line. Another is an operation of detecting a state of a memory cell of the memory cell array via the bit line. Another is an operation of applying a write control voltage to a memory cell of the memory cell array 1 via the bit line to execute write to the memory cell. The bit line control circuit 2 is connected with a column decoder 3 and a data input/output buffer 4. A data storage circuit of the bit line control circuit 2 is selected by the column decoder 3. Data of the memory cell read by the data storage circuit is externally output from a data input/output terminal 5 via the data input/output buffer 4. The data input/output terminal 5 is connected to a host (not show) outside a memory chip. For example, the host comprises a microcomputer, and receives data output from the data input/output terminal 5. The host further outputs various commands CMD for controlling the operation of the NAND flash memory, address ADD and data DT. Write data input from the host to the data input/output terminal 5 is supplied to a data storage circuit selected by the column decoder 3 via the data input/output buffer 4. Commands and addresses are supplied to a control signal and control voltage generation circuit 7.

The word line control circuit 6 is connected to the memory cell array 1. The circuit 6 selects a word line of the memory cell array 1, and then, applies a voltage required for read, write or erase to the selected word line.

The memory cell array 1, bit line control circuit 2, column decoder 3, data input/output buffer 4 and word line control circuit 6 are connected to the control signal and control voltage generation circuit 7 for control thereof. The circuit 7 is connected to a control signal input/output terminal 8, and controlled according to control signals ALE (address latch enable), CLE (command latch enable) and WE (write enable), which are input from the host via the terminal 8.

The foregoing bit line control circuit 2, column decoder 3, word line control circuit 6 and control signal and control voltage generation circuit 7 form a write circuit and a read circuit.

FIG. 2 shows each configuration of the memory cell array 1 and the bit line control circuit 2. The memory cell array 1 has a plurality of arrayed NAND cells. For example, one NAND cell is composed of a memory cell MC comprising 64 serial-connected EEPROMs, two dummy cells DCS, DCD, select gates S1 and S2. The select gate S2 is connected to a bit line BL0e while the select gate S1 is connected to a source line SRC. Control gates of memory cells MC arrayed in each row are connected in common to word lines WL0 to WL63. Gates of dummy cells DCS and DCD are connected to dummy word lines WLDS and WLDD, respectively. The select gate S2 is connected in common to a select line SGD while the select gate S1 is connected in common to a select line SGS.

The bit line control circuit 2 has a plurality of data storage circuits 10. Each of the data storage circuits 10 is connected with a pair of bit lines (BL0e, BL0o), (BL1e, BL1o), . . . (BLie, BLio), (BLne, BLno).

The memory cell array 1 includes a plurality of blocks as shown by the broken line. Each block comprises a plurality of NAND cells. For example, data is erased in units of blocks. An erase operation is simultaneously carried out with respect to two bit lines connected to the data storage circuit 10.

A plurality of memory cells (i.e., range surrounded by the broken line) alternately arranged in the bit line and connected to one word line forms one sector. Data is written and read for each sector. In other words, half of the memory cells arrayed in the row direction are connected to the corresponding bit lines. Thus, a write or read operation is carried out for each half of memory cells arrayed in the row direction.

In a read operation, a program verify operation and a program operation, one of two bit lines (BLie, BLio) connected to the data storage circuit 10 is selected in accordance with address signals (YA0, YA1 . . . YAi . . . YAn) externally supplied. In accordance with an external address, one word line is selected by a second page shown by the broken line. The second page is changed according to the address.

Figure 3:
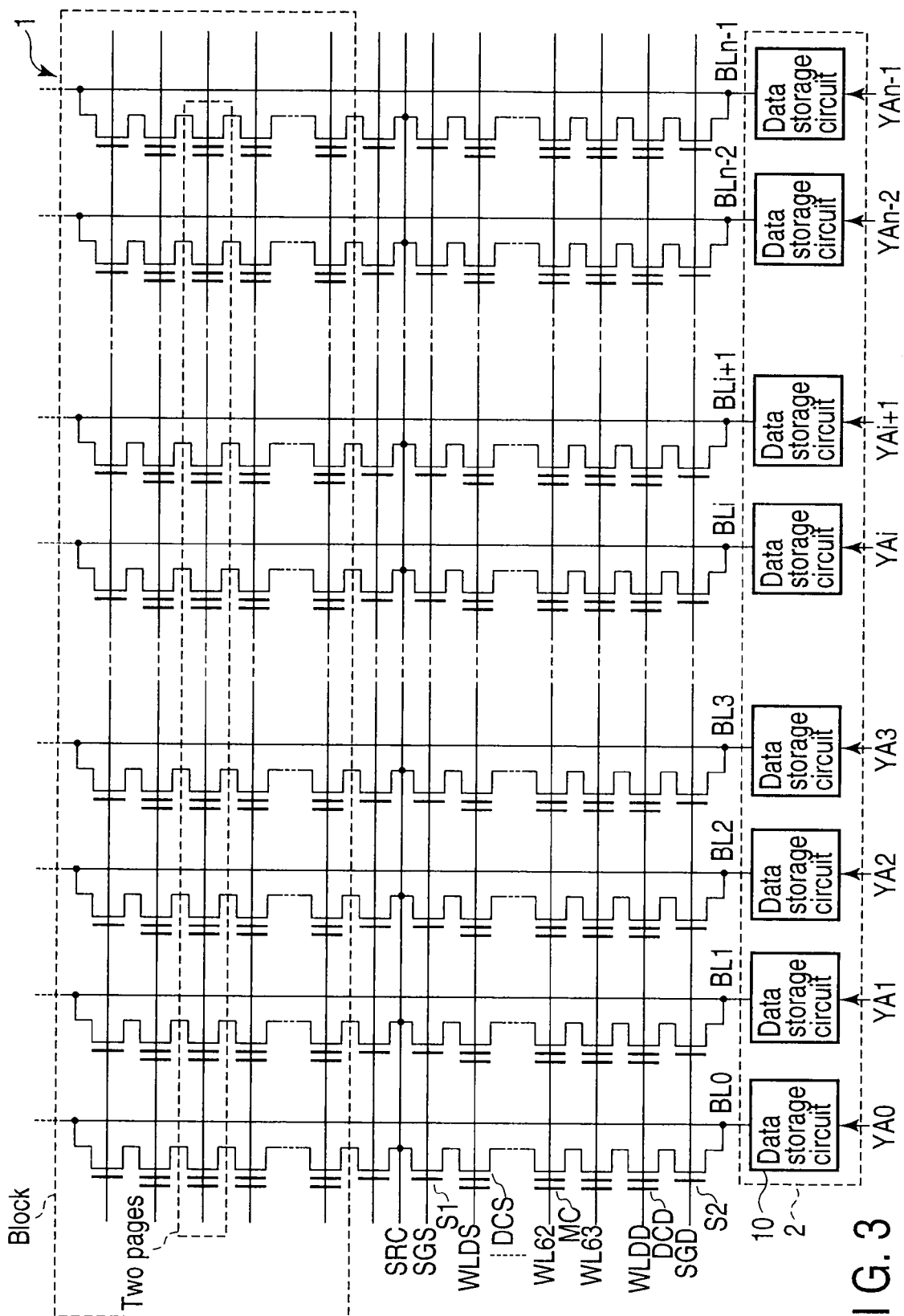
FIG. 3 is a circuit diagram showing another configuration of the memory cell array.

FIG. 3 shows another configuration of the memory cell array 1 and the bit line control circuit 2 which are shown in FIG. 1. According to the configuration shown in FIG. 2, two bit lines (BLie, BLio) are connected to the data storage circuit 10. However, according to the configuration shown in FIG. 3, each bit line is connected with a data storage circuit 10. Thus, a write or read operation is carried out with respect to all memory cells arrayed in the row direction.

In the following description, the configurations shown in both FIG. 2 and FIG. 3 are applicable; however, the case of using the configuration shown in FIG. 3 will be described below.

Figure 4A:
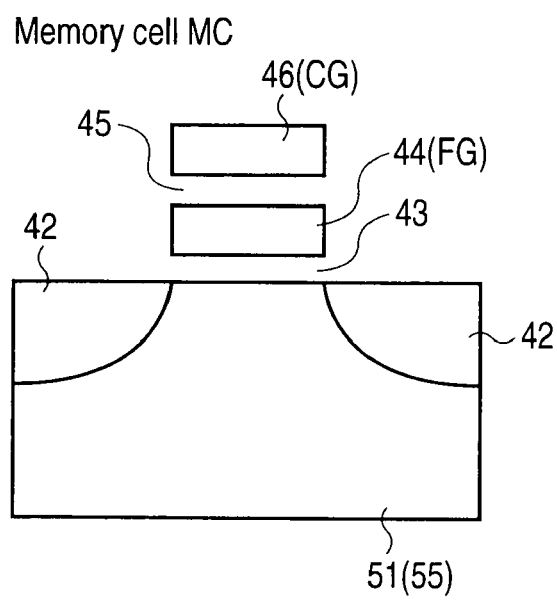
FIGS. 4A and 4B are cross-sectional views showing a memory cell and a select transistor, respectively.
Figure 4B:
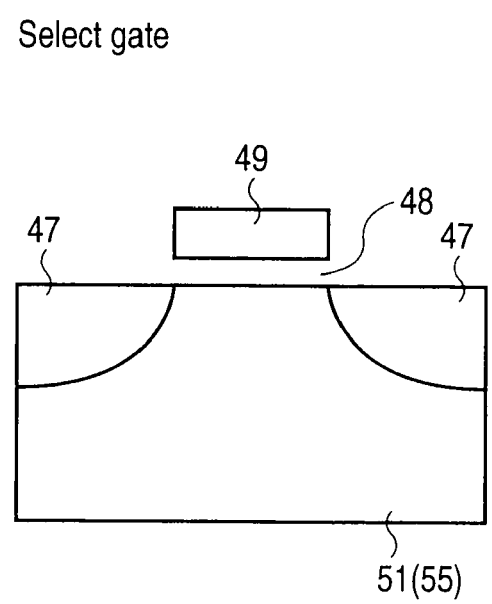

FIGS. 4A and 4B show cross-sectional views of a memory cell and a select transistor, respectively. FIG. 4A shows a memory cell. A substrate 51 (P-well region 55 described later) is formed with an n-type diffusion layer 42 functioning as source/drain. A floating gate (FG) 44 is formed on the P-well region 55 via an insulating film 43. Further, a control gate (CG) 46 is formed on the floating gate 44 via an insulating film 45. The P-well region 55 is formed with an n-type diffusion layer 47 functioning as source/drain. A control gate 49 is formed on the P-well region 55 via a gate insulating film 48.

Figure 5:
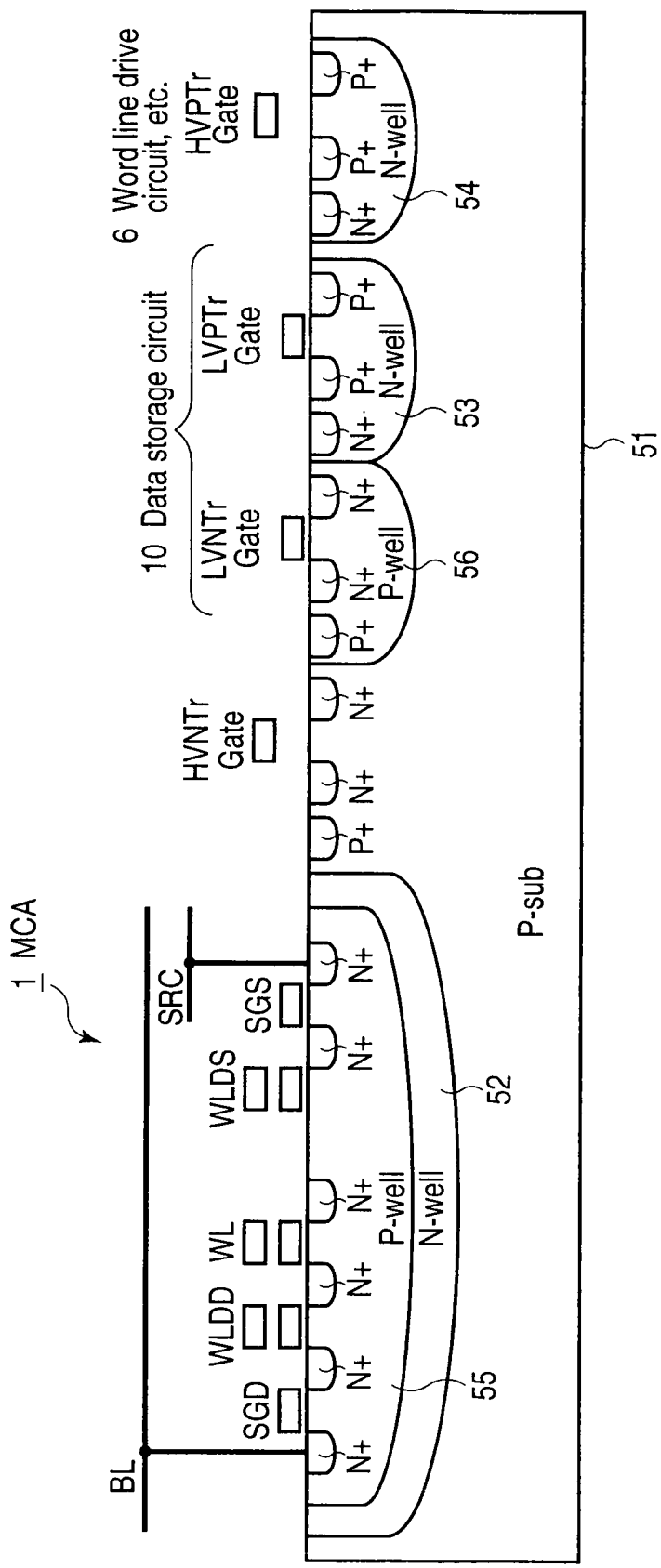
FIG. 5 is a cross-sectional view showing a NAND flash memory.

FIG. 5 shows a cross section of a NAND flash memory. For example, a P-type semiconductor substrate 51 is formed with N-well regions 52, 53, 54, and a P-well region 56. A P-well region 55 is formed in the N-well region 52. The P-well region is formed with a low-voltage N-channel transistor LVNTr forming the memory cell array 1. Moreover, the N-well region 53 and the P-well region 56 are formed with a low-voltage P-channel transistor LVPTr and a low-voltage N-channel transistor LVNTr forming the data storage circuit 10, respectively. The substrate 51 is formed with a high-voltage N-channel transistor HVNTr connecting the bit line and the data storage circuit 10. The N-well region 54 is formed with a high-voltage P-channel transistor HVPTr forming a word line drive circuit. As shown in FIG. 5, high-voltage transistors HVNTr and HVPTr have a thicker gate insulating film than low-voltage transistors LVNTr and LVPTr.

FIG. 6 is a table showing a voltage supplied to each region shown in FIG. 5. In erase, program and read operations, a voltage shown in FIG. 6 is applied to each region. In FIG. 6, Vera is a voltage applied to the substrate when data is erased, Vss is a ground voltage, and Vdd is a power supply voltage. In FIG. 6 VpgmH is a voltage Vpgm+Vth applied to a word line when data is written. VpassH is a voltage Vpass+Vth applied to a word line of a non-selected cell when data is written. VreadH is a voltage Vread+Vth applied to a word line when data is read.

Figure 7:
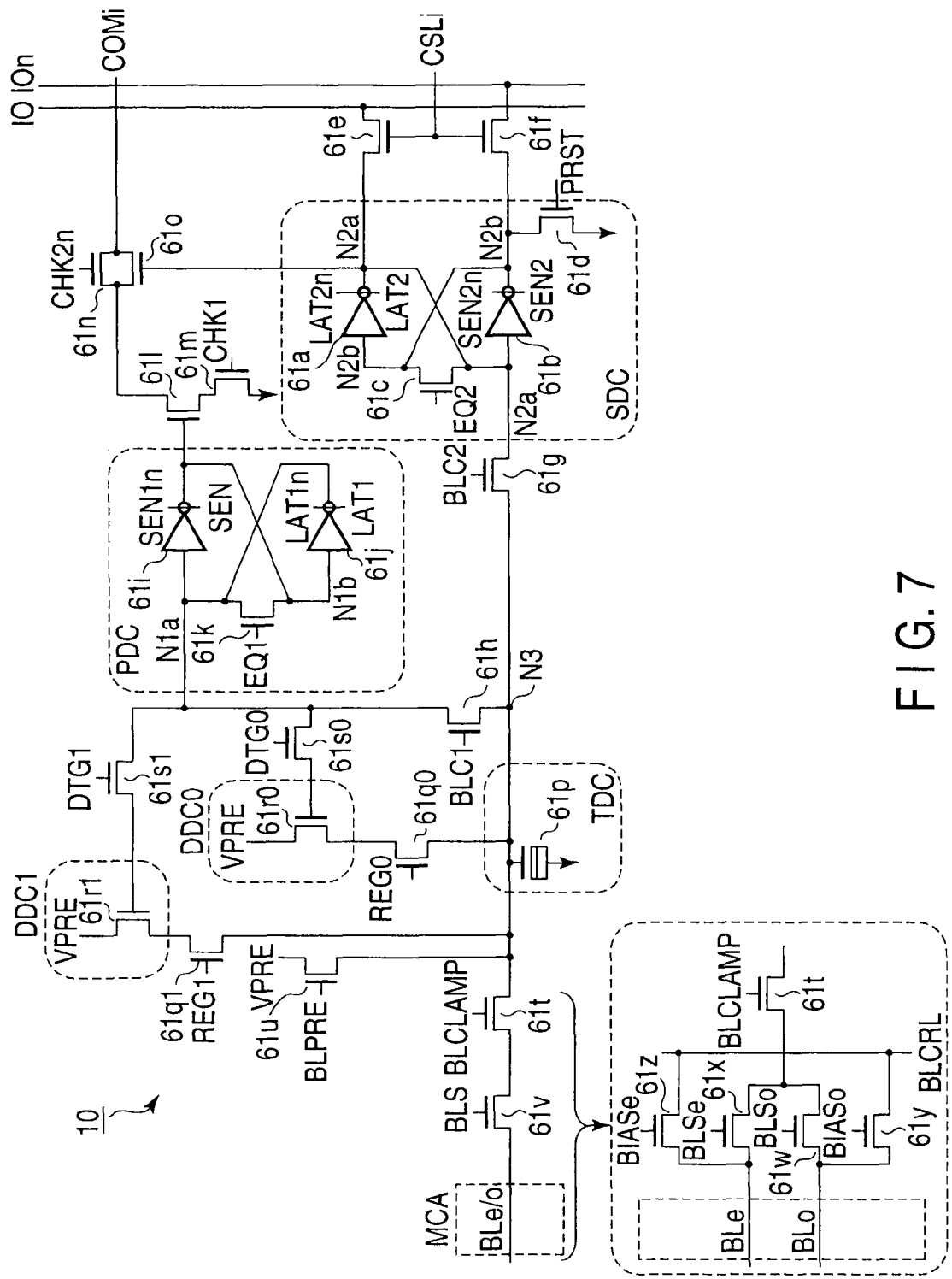
FIG. 7 is a circuit diagram showing the configuration of data storage circuit shown in FIGS. 2 and 3.

FIG. 7 is a circuit diagram showing the configuration of the data storage circuit 10 shown in FIG. 3.

The data storage circuit 10 writes and reads 2-bit four-value data, and has a primary data cache (PDC), a secondary data cache (SDC), dynamic data caches (DDC0, DDC1) and a temporary data cache (TDC). The foregoing SDC, PDC, DDC0 and DDC1 hold input data in a write operation, hold read data in a read operation, temporarily hold data in a verify operation, and are also used for controlling internal data when storing multi-value data. The TDC amplifies data of a bit line when data is read, and temporarily holds it, and further, is used for controlling internal data when storing multi-value data.

The SDC is composed of clocked inverter circuits 61$a$, 61$b$ forming a static latch circuit, and transistors 61$c$ and 61$d$. The transistor 61$c$ is connected between an input terminal of the clocked inverter circuit 61$a$ and an input terminal of the clocked inverter circuit 61$b$. The gate of the transistor 61$c$ is supplied with a signal EQ2. The transistor 61$d$ is connected between an output terminal of the clocked inverter circuit 61$a$ and ground. The gate of the transistor 61$d$ is supplied with a signal PRST. A node N2$a$ of the SDC is connected to an input/output data line IO via a column select transistor 61$e$. A node N2$b$ of the SDC is connected to an input/output data line IOn via a column select transistor 61$f$. Each gate of the foregoing transistors 61$e$ and 61$f$ is supplied with a column select signal CSLi. The node N2$a$ of the SDC is connected to a node N1$a$ of the PDC via transistors 61$g$ and 61$h$. The gate of the transistor 61$g$ is supplied with a signal BLC2 while the gate of the transistor 61$h$ is supplied with a signal BLC1.

The PDC is composed of clocked inverter circuits 61$i$, 61$j$ forming a static latch circuit, and transistor 61$k$. The transistor 61$k$ is connected between an input terminal of the clocked inverter circuit 61$i$ and an input terminal of the clocked inverter circuit 61$j$. The gate of the transistor 61$k$ is supplied with a signal EQ1. A node N1$b$ of the PDC is connected to the gate of a transistor 61$l$. One terminal of a current path of the transistor 61$l$ is grounded via a transistor 61$m$. The gate of the transistor 61$m$ is supplied with a signal CHK1. The other terminal of the transistor 61$m$ is connected to one terminal of transistors 61$n$ and 61$o$ forming a transfer gate. The gate of the transistor 61$n$ is supplied with a signal CHK2. The gate of the transistor 61$o$ is connected to a node Na2. The other terminal of the current path of the transistors 61$n$ and 61$o$ is connected to a signal line COMi. The signal line COMi is connected in common to all data storage circuits 10. Whether or not a verify operation of all data storage circuits 10 is completed is determined by the level of the signal line COMi. As described later, when the verify operation is completed, a node N1$b$ of the PDC is set to a low level (node N1$a$ is set to a high level). In this state, when signals CHK1 and CHK2 are set to a high level, the signal COMi is set to a high level if the verify operation is completed.

The TDC comprises a MOS capacitor 61$p$, for example. The capacitor 61$p$ has one terminal connected to a connection node N3 of the transistors 61$g$ and 61$h$ and the other terminal grounded. The connection node N3 is connected with DDC0 and DDC1 via transistors 61$q$0 to 61$q$1. The gates of the transistors 61$q$0 and 61$q$1 are supplied with signals REG0 and REG1, respectively.

DDC0 and DDC1 forming the dynamic latch circuit comprise transistors 61$r$o and 61$r$1, respectively. One terminal of a current path of transistors 61$r$0 and 61$r$1 is supplied with a signal VPRE while the other terminal thereof is connected to a current path of the transistors 61$q$0 and 61$q$1. Each gate of transistors 61$r$0 and 61$r$1 is connected to the node N1$a$ of the PDC via transistors 61$s$0 and 61$s$1. Each gate of transistors 61$s$0 and 61$s$1 is supplied with signals DTG0 and DTG1.

The connection node N3 is connected with one terminal of a current path of transistors 61$t$ and 61$u$. The other terminal of the current path of the transistor 61$u$ is supplied with a signal VPRE while the gate thereof is supplied with a signal BLPRE. The gate of the transistor 61$t$ is supplied with a signal BLCLAMP. The other terminal of the current path of the transistor 61$t$ is connected to one terminal of the bit line BLo/e via a transistor 61$v$.

In the data storage circuit shown in FIG. 2, the configuration between the transistor 61$t$ and odd and even bit lines BLo and BLe is modified as shown in FIG. 7. In this case, transistors 61$w$ and 61$x$ are connected between the transistor 61$t$ and odd and even bit lines BLo and BLe. Each gate of transistors 61$w$ and 61$x$ is supplied with signals BLSo and BLSe. A connection node of the bit line BLo and the transistor 61$x$ is connected with one terminal of a current path of a transistor 61$y$. A connection node of the bit line BLe and the transistor 61$x$ is connected with one terminal of a current path of a transistor 61$z$. Each gate of transistors 61$y$ and 61$z$ is supplied with signals BIASo and BIASe. The other terminal of transistors 61$y$ and 61$z$ is supplied with a signal BLCRL. Thus, one terminal of bit lines BLo and BLe is supplied with a signal BLCRL via transistors 61$y$ and 61$z$. The signal BLCRL is a voltage applied to a non-select bit line in read and program operations.

Hereinafter, data of the PDC is set to the potential of the node N1$a$, data of the SDC is set to the potential of the node N2$a$, and data of the TDC is set to the potential of the node N3. Data of DDC0 and DDC1 are set to the potential of the gates of transistors 61$r$0 and 61$r$1.

The foregoing signals and voltages are generated by the control signal and control voltage generation circuit 7 shown in FIG. 1. Data write, verify and read operations are controlled based on the control of the control signal and control voltage generation circuit 7.

Figure 8:
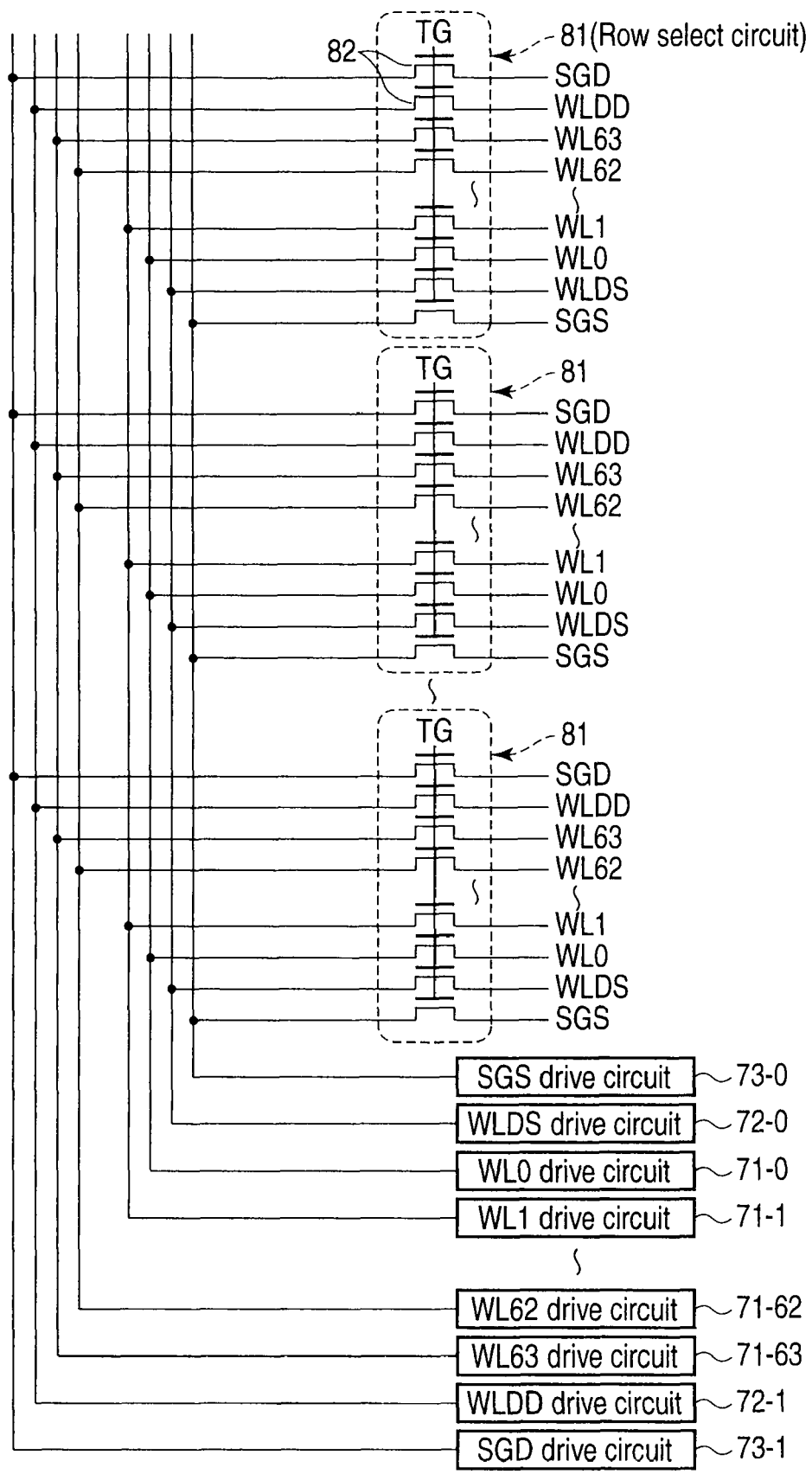
FIG. 8 is a circuit diagram showing the configuration of each row select circuit and each drive circuit.

FIG. 8 shows the configuration of each row select circuit and word line drive circuit, which are included in the word line control circuit 6 shown in FIG. 1. A row select circuit 81 is arrayed correspondingly to each block shown in FIGS. 2 and 3. Each row select circuit 81 has a plurality of transfer gates 82 comprising a plurality of N-channel MOS transistors. Gate electrodes TG of the transfer gates 82 are connected in common.

Word lines WL0 to WL63, dummy word lines WLDS, WLDD, select lines SGS and SGD are connected to one terminal of a current path of the transfer gates 82 forming the corresponding row select circuit 81. The other terminal of the transfer gates 82 is connected to word line (WL0 to W163) drive circuits 71-0 to 71-63, dummy word line (WLDS, WLDD) drive circuits 72-0, 72-1, and select line (SGS, SGD) drive circuits 73-0 and 73-1. The foregoing word line drive circuits 71-0 to 71-63, dummy word line drive circuits 72-0, 72-1, select line drive circuits 73-0 and 73-1 are provided in the control signal and control voltage generation circuit 7. The circuit 7 generates a predetermined voltage in a write operation (program), a verify operation and a read operation.

Figure 9A:
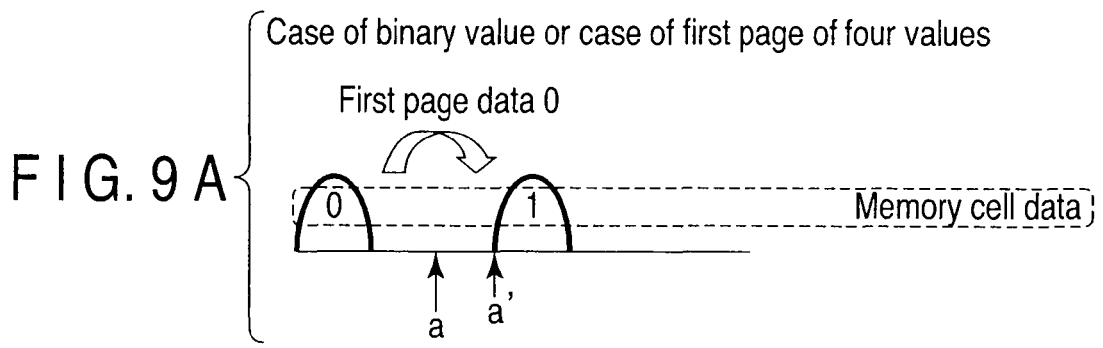
FIGS. 9A to 9C are views showing a threshold voltage distribution of a memory cell according to write and erase operations.
Figure 9B:
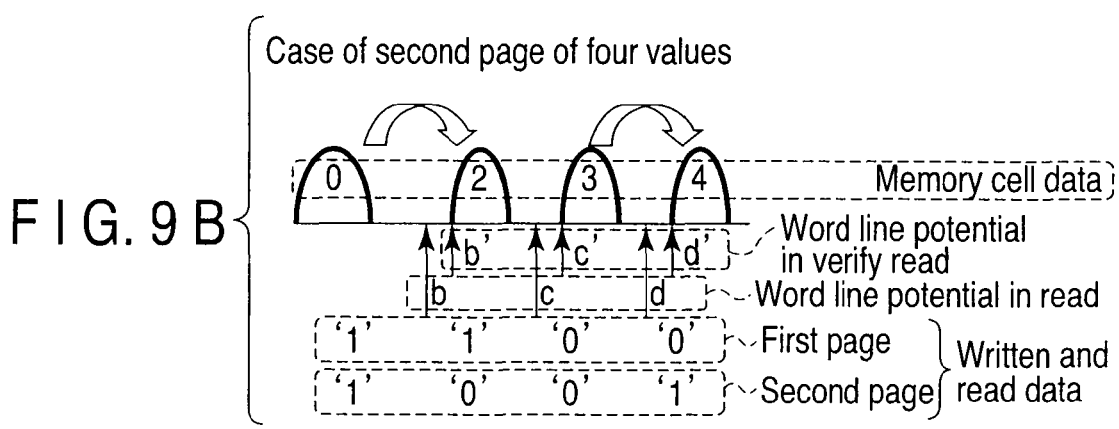
Figure 9C:
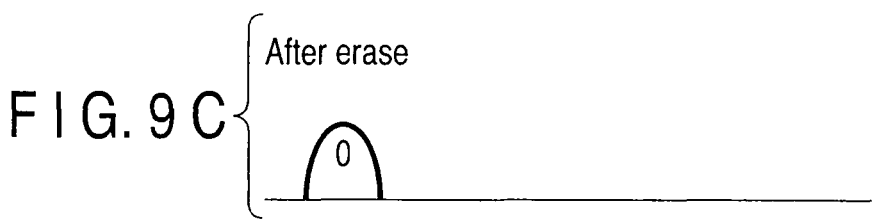

FIGS. 9A to 9C show the relationship between data and threshold of a memory cell. As shown in FIG. 9, when an erase operation is carried out, data of the memory cell is "0". As depicted in FIG. 9A, according to the two-value case of storing one bit in one cell, data of the memory cell is "0" and "1" by a write operation. According to the four-value case of storing two bits in one cell, one-bit data is written by a first page as shown in FIG. 9A, and thus, data of the memory cell is "0" and "1". As seen from FIG. 9B, one-bit data is further written by a second page, and thus, data of the memory cell is "0", "2", "3" and "4".

(Read Operation)

According to the two-value case of storing one bit in one cell shown in FIG. 9A, data of the memory cell exists as "0" or "1". For this reason, a read operation is carried out according to an intermediate level "a" of data threshold voltage, and thereby, data can be read.

According to the four-value case of storing two bits in one cell shown in FIG. 9B, data of the memory cell exists as "0", "2", "3" and "4". For this reason, a read operation is carried out according to an intermediate level "b" of data "0" and "2", an intermediate level "c" of data "2" and "3", and an intermediate level "d" of data "3" and "4". In this way, these data can be read.

Figure 10:
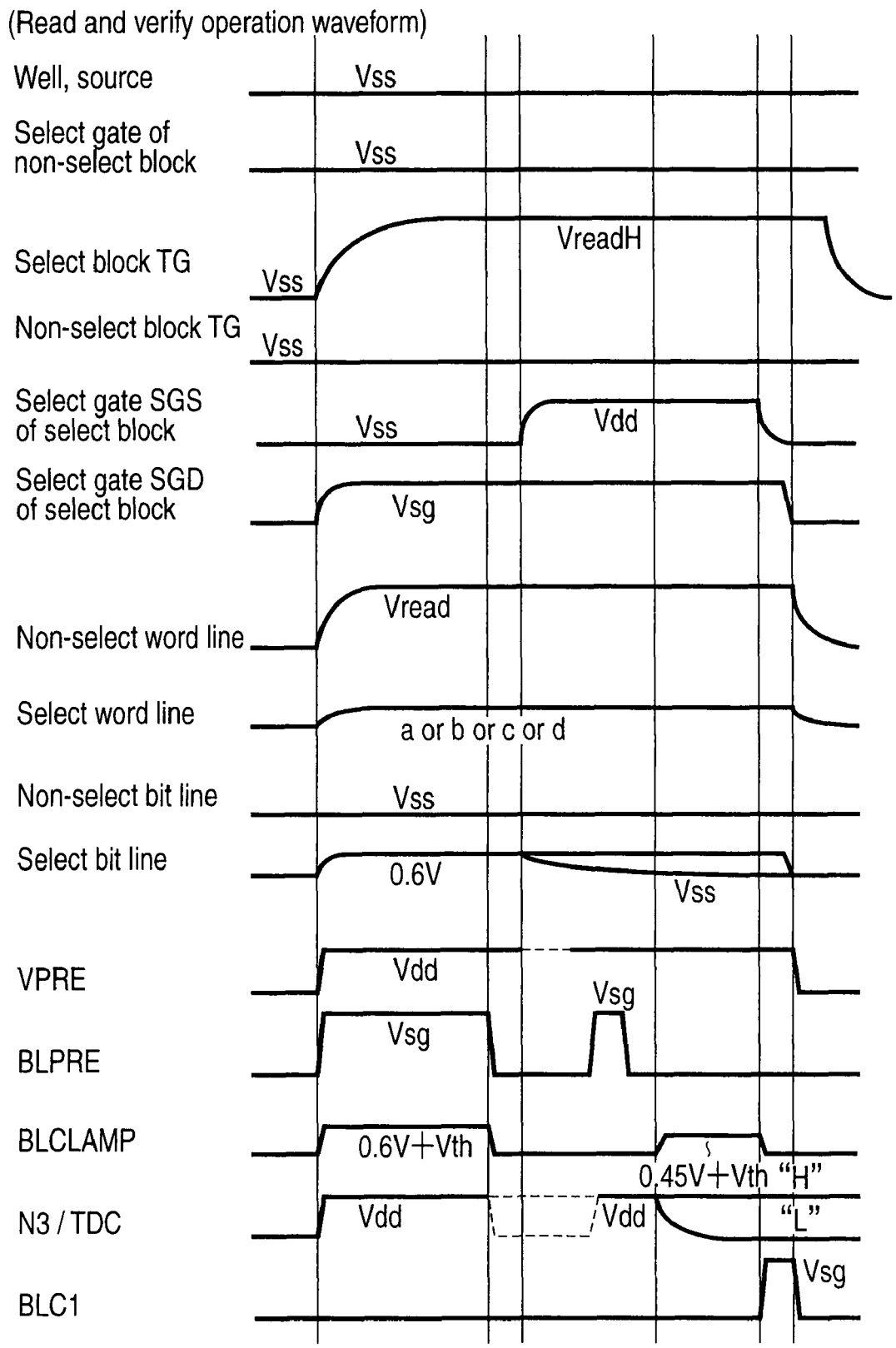
FIG. 10 is a waveform chart showing read and verify read operations.

FIG. 10 shows read and verify read operation waveforms. The read operation will be described below with reference to FIG. 10.

First, the well of the selected cell, a source line and a non-select bit line are set to 0 V.

A gate electrode GT of the transfer gate 82 of the selected block is supplied with a voltage VreadH (Vread+Vth). Any of voltages "a", "b", "c" and "d" (e.g., "a"="b"=0 V) of a read operation is supplied to the select word line by word line drive circuits 71-0 to 71-63. Simultaneously, a non-select word line of the selected block is supplied with a voltage Vread, a select line SGD of the selected block is supplied with a voltage Vsg (Vdd+Vth), and a select line SGS is supplied with a voltage Vss. Further, the signal VPRE of the data storage circuit 10 shown in FIG. 7 is supplied with Vdd (e.g., 2.5 V), and the signal BLPRE is supplied with Vsg (Vdd+Vth), and the signal BLCLAMP is temporarily supplied with a voltage (e.g., 0.6+Vth). In this way, the bit line is pre-charged to 0.6 V, for example.

The select line SGS on the source side of the memory cell is set to a voltage Vsg (Vdd+Vth). If the threshold voltage of the memory cell is higher than any of voltages "a", "b", "c" and "d" (e.g., "a"="b"=0 V), the memory cell turns off. For this reason, the bit line is remains at a high level (e.g., 0.6 V). If the threshold voltage of the memory cell is lower than any of voltages "b", "c" and "d" (e.g., "b"=0 V), the memory cell turns on. Thus, the bit line is discharged, and set to the same potential as the source, that is, Vss.

Thereafter, the signal BLPRE of the data storage circuit 10 shown in FIG. 7 is temporarily set to a voltage Vsg (Vdd+Vth). In this way, the node N3 of the TDC is pre-charged to a voltage Vdd, and then, the signal BLCLAMP is set to a voltage (e.g., 045 V+Vth). The node N3 of the TDC is set to a low level when the voltage of the bit line is lower than 0.45 V. On the other hand, when the voltage of the bit line is higher than 0.45 V, the node N3 remains at a high level. In this case, the signal BLC1 is set to a voltage Vsg (Vdd+Vth) so that the potential of the TDC is read to the PDC. Therefore, if the threshold voltage of the memory cell is lower than levels "a", "b", "c" and "d", the PDC is set to a low level. If the threshold voltage is higher than the foregoing levels, the PDC is set to a high level.

As shown in FIG. 3, when all cells arrayed in the row direction are collectively read, the select line SGS of the selected block is set to a high level at the same time with the select line SGD of the selected block. Thus, the bit line is charged, and thereafter, if the memory cell is in an on state, the bit line is discharged. Conversely, if the memory cell is in an off state, the bit line is kept in a charged state.

As described above, the level of the bit line is read to the PDC via the TDC. Thus, if many on-state cells exist, a large current is carried from the signal VPRE to the source. Therefore, there is a problem that the source potential is floating. In order to solve the foregoing problem, the read operation is carried out several times. First, a turned-on cell, that is, a cell through which a current flows even if the source is floating is set to the read result of a low level without charging the bit line from the next time, and read is again carried out with respect to cell from which a low-level is read out at a first read time.

(Program and Program Verify)

(Program)

Figure 12:
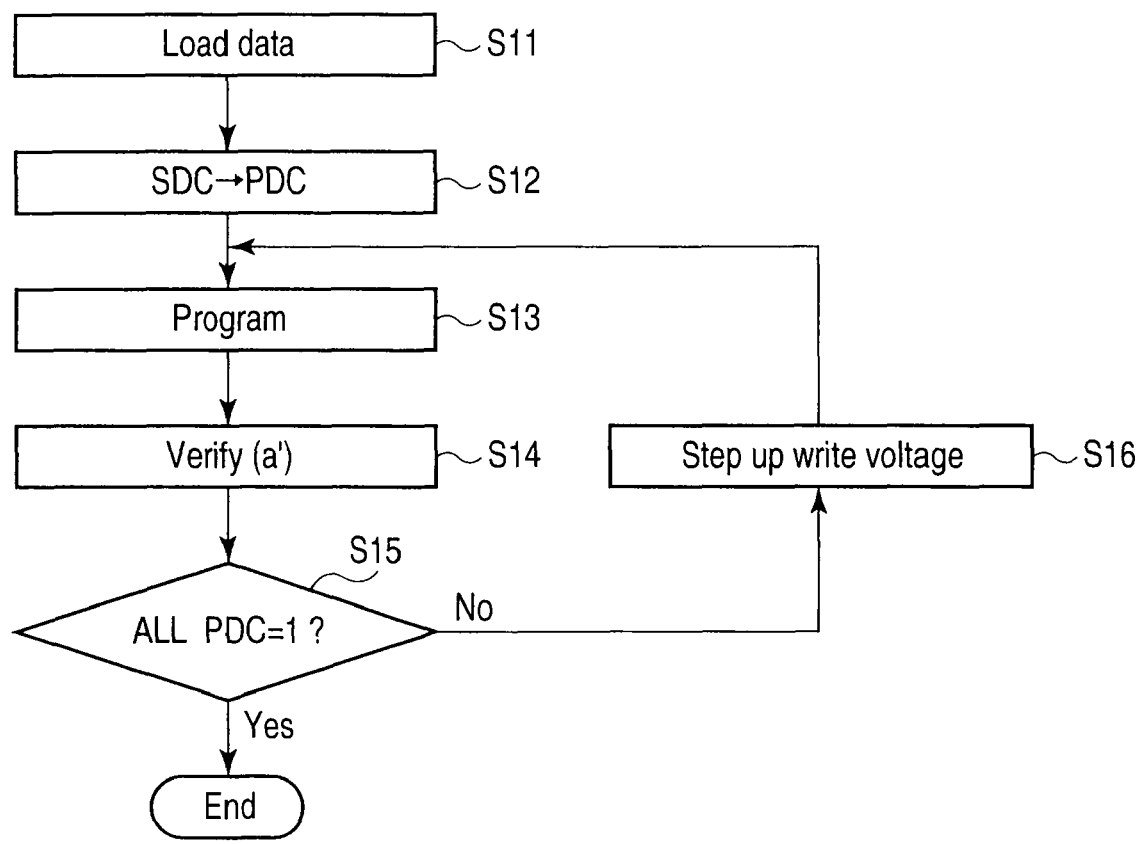
FIG. 12 is a flowchart to explain a first page write operation.
Figure 13:
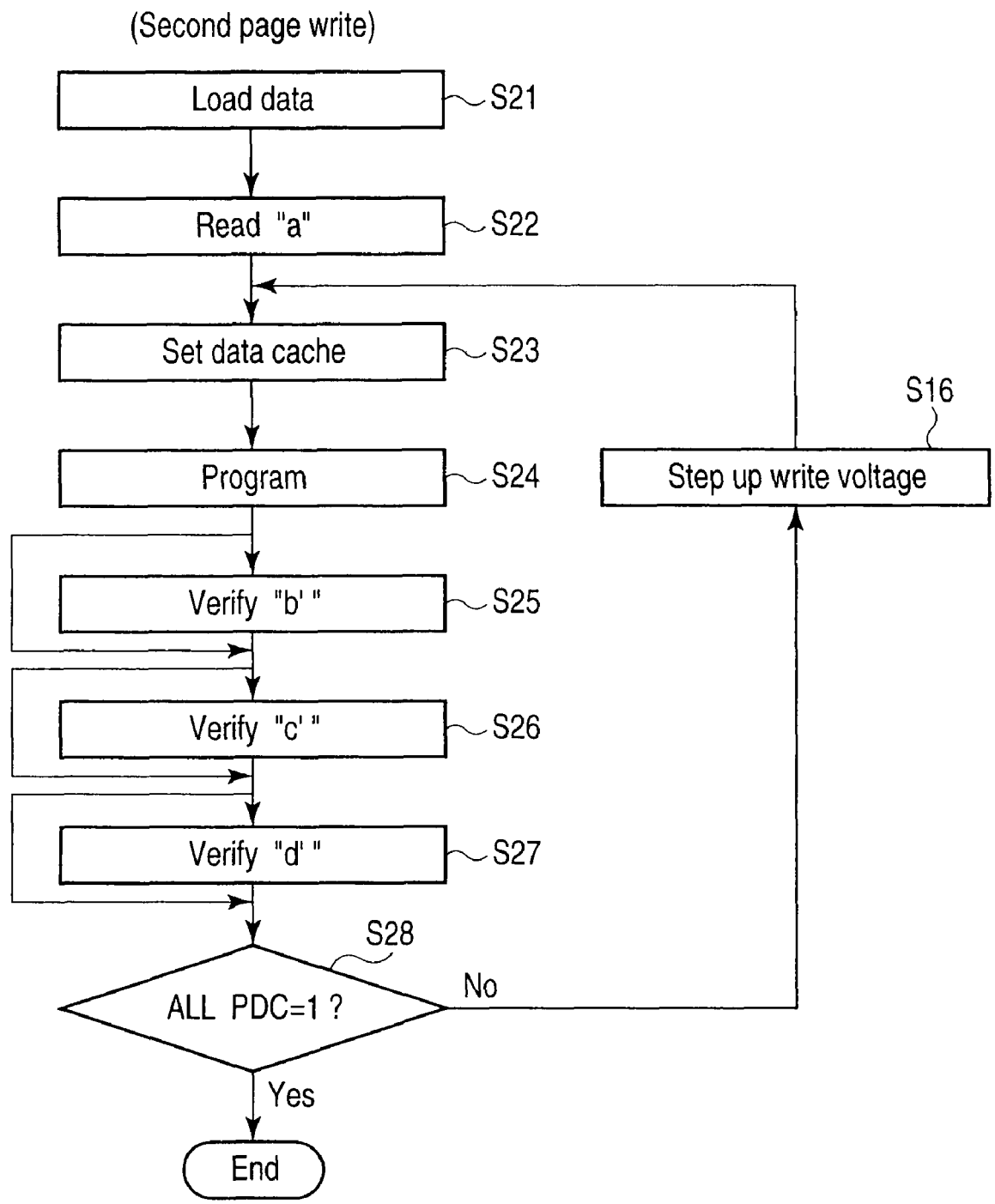
FIG. 13 is a flowchart to explain a second page write operation.

FIG. 11 shows a waveform of a program operation. FIG. 12 shows a first page program operation. FIG. 13 shows a second page program operation. The program operation will be described below with reference to FIGS. 11 to 13.

According to the program operation, an address is designated to select two pages, as shown in FIG. 3. This memory programs the foregoing two pages according to the order of the first page and second page. Therefore, the first page is initially selected according to this address.

(First Page Program)

Write data is input externally so that the data is stored in each SDC of all data storage circuits 10 (S11). When a write command is input, the data of each SDC of all data storage circuits 10 is transferred to the PDC (S12). When data "1" is input externally (no write is executed), the node N1$a$ of the PDC is set to a high level. Conversely, when data "0" is input (write is executed), the node N1$a$ is set to a low level.

(Program Operation (S13))

When signals BLC1, BLCLAMP and BLS of the data storage circuit 10 shown in FIG. 7 are set to a voltage Vsg (Vdd+Vth), the bit line is set to a voltage VDD if the PDC is stored with data "1" (no write is executed). Conversely, if the PDC is stored with data "0" (write is executed), the bit line is set to a voltage Vss. According to the case of FIG. 2, the cell is connected to the selected word line, and then, the cell of a non-select page (bit line is non-select) must not be written. For this reason, the bit lines connected to these cells are set to a voltage Vdd.

In the row select circuit 81 shown in FIG. 8, drive circuits 71-0 to 71-63, 72-0, 72-1, 73-0 and 73-1, the gate electrode TG of the transfer gate 82 forming the row select circuit 81 corresponding to the selected block is supplied with a voltage VpgmH_L (=Vpgm_L+Vth). The voltage Vpgm_L (e.g., 15 V) is lower than a write voltage Vprm (e.g., 20 V).

The select line SGD of the block selected from the SGD drive circuit 73-1 is supplied with a voltage Vsgd. The select word line is supplied with a voltage Vpgm_L. The non-word line is supplied with a voltage Vpass_L (e.g., 5 V). The voltage Vpass_L is lower than a voltage Vpass (e.g., 10 V).

A voltage supplied to the gate electrode TG of the transfer gate 82 corresponding to the select block is lowered from a voltage Vpgm_L (Vpgm_L+Vth) to VpassH (Vpass+Vth). In this way, the select word line is in a floating state. Thereafter, the potential of the non-select word line steps up from Vpass_L to Vpass. In this way, the potential of the non-select word line is stepped up to a write voltage Vpgm by coupling with neighboring non-select word lines as seen from the broken line shown in FIG. 11. In this state, if the potential of the bit line is Vss, the cell is programmed because the cannel potential of the cell is Vss and the word line is Vpgm.

On the other hand, if the potential of the bit line is Vdd, the SGD has a voltage lower than Vdd; for this reason, the select gate S2 turns off. In this case, the non-word line is Vpass while the select word line is Vpgm; thus, the channel potential of the cell is Vpgm/2 due to coupling. Therefore, the cell is not programmed.

As described above, the transfer gate 82 and the potential of the word line are controlled, and thereby, the word line is supplied with a voltage Vpgm_L lower than a voltage Vpgm. Further, the potential of the select word line steps up to Vpgm due to coupling with neighboring word lines, and thus, a program operation is performed. Therefore, there is no need to generate a write voltage Vpgm in a chip, and the circuit scale of the step-up circuit is reduced. In addition, it is possible to lower the breakdown voltage of a transistor forming the peripheral circuit.

(Program Verify (S14))

According to a program verify in a binary- or four-value first page case, a program verify operation is carried out using a verify level "a'" as seen from FIG. 9A (S14). First, the potential of each of the well of the selected cell, the source line and the non-select bit line is set to a voltage Vss. Thereafter, the select word line is supplied with a voltage (a'=0.5 V) slightly higher than a verify voltage (voltage (a=0 V) in read operation) to read the threshold voltage of the memory cell. The program verify operation is substantially the same as the foregoing read operation, thus a detailed explanation is omitted.

The program verify is performed; as a result, if the threshold voltage of the memory cell reaches a verify level "a'", the PDC shown in FIG. 7 is set to a high level (data "1"). Conversely, if the threshold voltage of the memory cell does not reach the verify level "a'", the PDC is set to a low level (data "0") (S15). When the PDC is a low level, a voltage Vpgm_L supplied to the select word line is slightly stepped up, and then, a program operation is again carried out (S15, S16, S13).

The foregoing program and program verify are repeated until the data of each PDC of all data storage circuit 10 becomes "1" (S15 to S13). When the data of each PDC of all data storage circuit 10 becomes "1", the second page is programmed.

(Step Up (S16))

According to this embodiment, the number of write memory cells is high in the initial program loop. For this reason, there are many cells having channels at Vss. However, when the program loop gradually closes the end, there are a large number of non-write cells; therefore, the number of write cells is reduced. For this reason, there are many cells with boosted channels. When there are many boosted channels, the potential of the select word line stepped up by coupling becomes high. This condition is convenient for the program operation of this embodiment because the number of program loops increases and the voltage Vpgm of the select word line steps up due to coupling with neighboring word lines.

The potential of the select word line stepped up by coupling changes depending on the number of data "1" (non-write) and "0" (write). However, recently, a controller provided either within or exterior to a chip performs control so that the number of data "1" and data "0" in one page write data becomes approximately uniform. Therefore, the foregoing problem, that is, a change in the potential of the select word line resulting from a ratio of the number of data "1" and data "0" in one page appears less.

Of course, each potential of Vpgm_L and Vpass_L can be corrected in accordance with the write voltage Vpgm. In addition, each potential of Vpgm_L and Vpass_L can be corrected in accordance with the number of write data "1" and data "0" in a write page.

(Second Page Program)

In a four-value second page program shown in FIG. 13, a second page is selected according to address, and then, data of the second page is loaded to the SDC (S21). According to the second page program, there is a need to check whether or not write is performed with respect to a memory cell according to the first page program. For this reason, data of the memory cell is read using a read level "a" (S22). The read data is held in the PDC. Thereafter, write data loaded to the SDC and data read to the PDC are controlled using DDC0, DDC1 and TDC, and thus, data is set to the PDC (S23). For example, if the first page data is "1" and the second page data is "1", data "1" is set to the PDC. If the first page data is "1" and the second page data is "0", data "0" is set to the PDC. If the first page data is "0" and the second page data is "0", data "1" is set to the PDC. If the first page data is "0" and the second page data is "1", data "0" is set to the PDC.

Thereafter, a program operation is carried out (S24). The second page program operation is the same as the first page program operation, and thus, the potential of the select word line is stepped up by coupling with the potential of neighboring word lines.

A program verify operation is carried out using verify levels "b'", "c'" and "d'" (S25, S26, S27). The verify operation is carried out; as a result, if all PDCs are not at a high level, a voltage Vpgm_L supplied to the select word line is slightly lowered, and then, the program operation is again carried out (S28, S26, S24). The foregoing operation is repeated until all PDCs are set to a high level.

(Erase Operation)

An erase operation is carried out in units of blocks, as shown by the broken line in FIG. 3. After erase, the threshold of the cell is set to data "0" of the memory cell as seen from FIG. 9C.

According to this embodiment, no data is written to cells adjacent to select gates S1 and S2 as dummy cells DCS and DCD. The reason for this is that, of the cells adjacent to select gates S1 and S2, only one memory cell on the side opposite to select gates S1 and S2 is used as a non-select word line in a write operation. For this reason, compared with other memory cells, when the non-select word line is stepped up from Vpass to Vpass, a voltage stepping up from VpgmL to Vpgm by coupling is not sufficient. Memory cells adjacent to select gates have a bad device characteristic due to advanced scale reduction. The following course is taken with respect to the foregoing memory cell. Specifically, each potential of Vpgm_L and Vpass_L is corrected, or the voltage of the select gate is previously lowered, and then, the voltage of the non-select word line is stepped up at timing stepping up from Vpass_L to Vpass. In this way, the memory cell is usable as a normal memory cell. However, the memory cell is given as a dummy cell because the write speed is reduced and complicated control is required.

According to the embodiment, all non-select word lines in the select block are temporarily set to a lower voltage Vpass_L, and thereafter, stepped up to Vpass. However, the present invention is not limited to the foregoing embodiment. For example, the non-select word line only adjacent to the word line is temporarily set to a lower voltage Vpass_L, and thereafter, stepped up to Vpass, and other non-select word lines are set to a fixed voltage.

In addition, only the non-select word line on one side of the select word lines in the select block may be always temporarily set to a lower voltage Vpass_L, and thereafter, stepped up to Vpass.

According to the embodiment, a voltage Vpgm_L lower than a write voltage Vpgm is applied to the select word line, and a voltage Vpass_L lower than a voltage Vpass is applied to the non-select word line. Thereafter, the voltage of the transfer gate 82 is lowered from VpgmH_L to VpassH so that the select word line is in a floating state. Thereafter, the potential of the non-select word line is increased from Vpass_L to Vpass. On the other hand, the potential of the select word line is set from Vpgm_L to a write voltage Vpgm using coupling of select word line with a non-select word line. Therefore, there is no need to generate a write voltage Vpgm in a chip, and a voltage Vpgm_L lower than Vpgm is generated. This serves to reduce the highest voltage of a chip; therefore, the circuit scale of a boost circuit is reduced while it is also possible to reduce a breakdown voltage of a transistor forming a peripheral circuit.

Specifically, according to the conventional program operation, there is a need to supply a voltage Vpgm (=e.g., 20 V) to a select word line while supplying a voltage Vpass (=e.g., 10 V) to a non-select word line. In addition, the select word line is supplied with Vpgm; for this reason, the gate electrode of the transfer gate must be supplied with a voltage VpgmH (=Vpgm+Vth) higher than Vpgm. According to the configuration, a chip requires a large-scale boost circuit, which generates voltages Vpgm and VpgmH. Further, a transistor requires a breakdown voltage durability against the voltages Vpgm and VpgmH. However, according to this embodiment, the boost circuit is miniaturized as described above, and the effect capable of reducing the breakdown voltage of a transistor is obtained.

It should be noted that the voltage supplied to the gate electrode TG of the transfer gate corresponding to the select block is lowered from VpgmH_L (Vpgm_L +Vth) to VpassH (Vpass+Vth). In this case, the voltage VpgmH_L (Vpgm_L+ Vth) may be supplied without being lowered to VpassH (Vpass+Vth).

In step S15 shown in FIG. 12 and in step S28 shown in FIG. 13, the program operation is repeated until data of the PDC of all data storage circuits 10 becomes data "1". However, the present invention is not limited to the foregoing embodiment. For example, the program operation may end when the number of data "1" of the PDC of several data storage circuits 10 reaches a predetermined (reference) value. In other words, some errors can be corrected using an error correction technique. Therefore, even if cells which do not end the program operation are present, it is possible to determine that the program normally ends so long as the number of the foregoing cells is within a predetermined error correction range. The foregoing configuration enables a high speed program operation even if the number of bits in one page increases.

Second Embodiment

Usually, according to a test before a chip is delivered, a write operation is carried out with respect to all cells. This test is conducted so that all word lines are supplied with a voltage Vpgm in order to shorten the test time. However, as described in the first embodiment, according to the present invention, the potential of the select word line is stepped up from Vpgm_L to Vpgm using coupling when the non-select word line is stepped up from Vpass_L to Vpass. For this reason, there is a problem that time is taken to perform the test with respect to all word lines.

In order to solve the foregoing problem, the second embodiment employs the following control. According to the control, if a test is made with respect to all word lines of Vpgm, for example, an odd word line is set as a select word line while an even word line is set as a non-select word line. Then, the non-select word line steps up from Vpass_L to Vpass while the potential of the select word line is stepped up by coupling. Thereafter, the even word line is set as a select word line while the odd word line is set as a non-select word line. Then, the non-select word line steps up from Vpass_L to Vpass while the potential of the select word line is stepped up by coupling. The foregoing control enables the test time to be shortened.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a memory cell array connected to a word line and a bit line, and composed of a plurality of memory cells arranged in a matrix, which store one value of an n value (wherein n is a natural number greater than 2); and
a control circuit configured to control each voltage of the word line and the bit line in accordance with input data, the control circuit supplying a first voltage to a word line of a selected cell in a write operation, and supplying a second voltage to at least one of non-select word lines adjacent to the selected cell, and thereafter, changing a voltage of said at least one of non-select word lines adjacent to the selected cell from the second voltage to a third voltage, wherein the second voltage is less than the third voltage,
wherein the word line of the selected cell is connected to a gate electrode of a first select transistor, and a word line of a non-selected cell is connected to a gate electrode of a second select transistor, and the gate electrodes of the first and second select transistors are connected in common and supplied with a common voltage, and
wherein the common voltage supplied to the gate electrodes of the first select transistor and the second select transistor is set to a fourth voltage after a fifth voltage is supplied with the gate electrodes of the first select transistor and the second select transistor in order to supply the second voltage to at least one word line adjacent to the selected cell and the first voltage to the word line of the selected cell, wherein the fifth voltage is greater than or equal to the fourth voltage and the fourth voltage is greater than the third voltage.

2. The device according to claim 1, wherein the word line of the non-selected cell is arranged at both sides of the word line of the selected cell.

3. The device according to claim 1, wherein the second voltage is less than the first voltage.

4. A semiconductor memory system comprising:
a memory cell array connected to a word line and a bit line, and composed of a plurality of memory cells arranged in a matrix, which store one value of an n value (wherein n is a natural number greater than 2); and a control circuit configured to control each voltage of the word line and the bit line in accordance with input data, the control circuit supplying a first voltage to a word line of a selected cell in a write operation, and supplying a second voltage to at least one word line adjacent to the selected cell, and thereafter, changing a voltage of said at least one word line adjacent to the selected cell from the second voltage to a third voltage, wherein the second voltage is less than the third voltage wherein the word line of the selected cell is connected to a gate electrode of the first select transistor, and a word line of a non-selected cell is connected to a gate electrode of a second select transistor, and the gate electrodes of the first and second select transistors are connected in common and supplied with a common voltage, and wherein the common voltage supplied to gate electrodes of the first select transistor and the second select transistor is set to a fourth voltage after a fifth voltage is supplied to the gate electrodes of the first select transistor and the second select transistor in order to supply the second voltage to at least one word line adjacent to the selected cell and the first voltage to the word line of the selected cell, wherein the fifth voltage is greater than or equal to the fourth voltage and the fourth voltage is greater than the third voltage.

5. The system according to claim 4, wherein the word line of the non-selected cell is arranged at both sides of the word line of the selected cell.

6. The device according to claim 4, wherein the second voltage is less than the first voltage.

7. A write method used for a semiconductor memory device, comprising:

supplying a first voltage to a word line of a selected cell;

supplying a second voltage to at least one word line adjacent to the selected cell; and setting a voltage of said at least one word line adjacent to the selected cell from the second voltage to a third voltage, wherein said second voltage is greater than said third voltage, and supplying a gate electrode of a first select transistor connected to the word line of the selected cell and a gate electrode of a second select transistor connected to a word line of a non-selected cell with a common voltage, and wherein the common voltage is set to a fourth voltage after a fifth voltage is supplied to the gate electrodes of the first select transistor and the second select transistor in order to supply the second voltage to at least one word line adjacent to the selected cell and the first voltage to the word line of the selected cell, wherein the fifth voltage is greater than or equal to the fourth voltage and the fourth voltage is greater than the third voltage.

8. The method according to claim 7, wherein the word line of the non-selected cell is arranged at both sides of the word line of the selected cell.

9. The method according to claim 7, wherein the second voltage is less than the first voltage.

10. The device according to claim 1, further comprising, changing the voltage of the word line of the selected cell from the first voltage to a sixth voltage, wherein the first voltage is less than the sixth voltage.

11. The system according to claim 4, further comprising, changing the voltage of the word line of the selected cell from the first voltage to a sixth voltage, wherein the first voltage is less than the sixth voltage.

12. The method according to claim 7, further comprising, setting a voltage of a word line of the selected cell from the first voltage to a sixth voltage, wherein the first voltage is less than the sixth voltage.

* * * * *